United States Patent
Kozai et al.

(10) Patent No.: US 9,159,623 B2
(45) Date of Patent: Oct. 13, 2015

(54) WAFER PROCESSING METHOD FOR REMOVING ORGANIC DEBRIS

(71) Applicant: DISCO CORPORATION, Tokyo (JP)

(72) Inventors: Hirohiko Kozai, Tokyo (JP); Atsushi Hattori, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/508,389

(22) Filed: Oct. 7, 2014

(65) Prior Publication Data

US 2015/0104928 A1    Apr. 16, 2015

(30) Foreign Application Priority Data

Oct. 10, 2013  (JP) .................................. 2013-212670

(51) Int. Cl.
*H01L 21/78* (2006.01)
*H01L 21/02* (2006.01)

(52) U.S. Cl.
CPC .......... *H01L 21/78* (2013.01); *H01L 21/02076* (2013.01)

(58) Field of Classification Search
None
See application file for complete search history.

(56) References Cited

U.S. PATENT DOCUMENTS

| 5,669,979 | A  | * | 9/1997 | Elliott et al. ...................... 134/1 |
| 6,498,075 | B1 | * | 12/2002 | Fujimoto et al. .............. 438/462 |
| 8,697,542 | B2 | * | 4/2014 | Pascual et al. ................ 438/455 |
| 2007/0054115 | A1 | * | 3/2007 | Codding et al. .............. 428/343 |
| 2007/0275543 | A1 | * | 11/2007 | Abe et al. ...................... 438/464 |
| 2009/0258447 | A1 | * | 10/2009 | Kurita ............................. 438/18 |
| 2009/0314438 | A1 | * | 12/2009 | Iwata et al. .................... 156/584 |
| 2010/0189479 | A1 | * | 7/2010 | Matsunaka et al. ........... 399/333 |
| 2011/0061691 | A1 | * | 3/2011 | Okano .......................... 134/157 |

FOREIGN PATENT DOCUMENTS

| JP | 2006-229021 | 8/2006 |
| JP | 2009-277778 | 11/2009 |

\* cited by examiner

*Primary Examiner* — Scott B Geyer
(74) *Attorney, Agent, or Firm* — Greer Burns & Crain Ltd.

(57) ABSTRACT

After performing a dividing step to divide a wafer into individual chips, an irradiation step is performed to apply ultraviolet radiation or plasma to the mount side of each chip, thereby generating ozone and active oxygen, which functions to remove organic matter sticking to the mount side of each chip. Accordingly, it is possible to remove from the mount side of each chip not only foreign matter sticking to the wafer during handling the wafer, but also foreign matter generated in dividing the wafer, so that faulty mounting of each chip can be reduced.

2 Claims, 8 Drawing Sheets

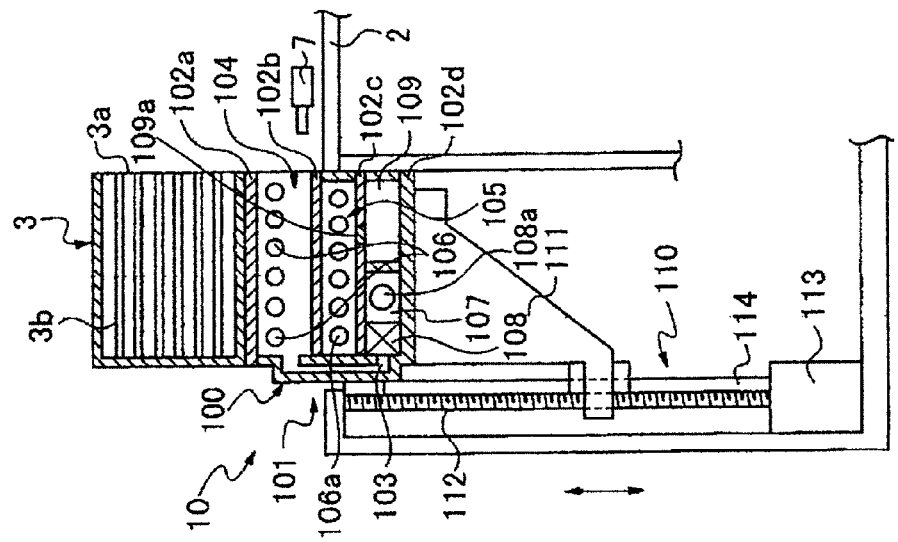
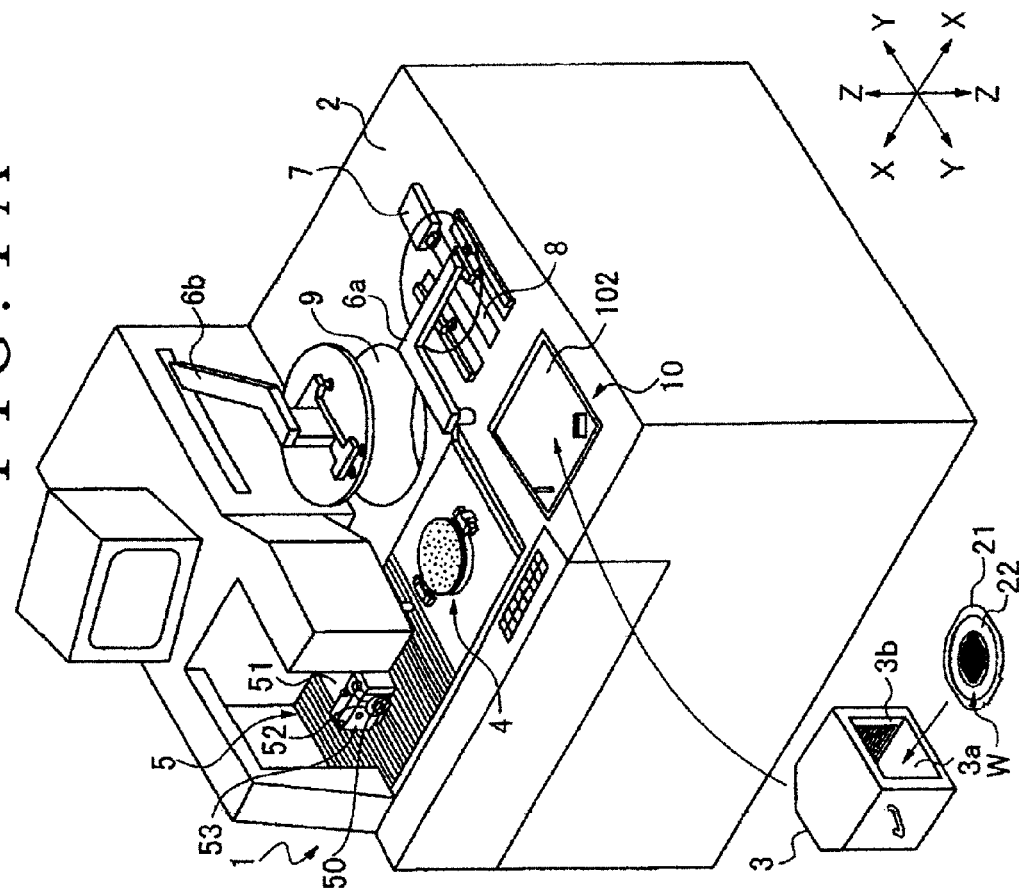

WAFER PROCESSING METHOD FOR REMOVING ORGANIC DEBRIS

BACKGROUND OF THE INVENTION

1. Field of the Invention

The present invention relates to a wafer processing method.

2. Description of the Related Art

In recent years, a flip chip mounting method has been widely adopted to reduce the size and thickness of a package. The flip chip mounting method is a method including the steps of forming a plurality of projection electrodes called bumps on the front side of a wafer for flip chip mounting and connecting each chip divided from the wafer through the bumps to a mounting substrate. The front side of the wafer for flip chip mounting is a mount side to be mounted to the mounting substrate, and the back side of the wafer is a grind side to be ground (see Japanese Patent Laid-open No. 2006-229021, for example).

As a method for dividing the wafer into the individual chips, there is a method including the steps of attaching the wafer to an adhesive tape supported to an annular frame, applying a laser beam to the wafer along a plurality of division lines to thereby form a modified layer inside the wafer along each division line, and expanding the adhesive tape to thereby divide the wafer into the individual chips along each division line where the modified layer is formed as a break start point (see Japanese Patent Laid-open No. 2009-277778, for example).

SUMMARY OF THE INVENTION

However, in many cases, the division of the wafer is performed by dicing with a blade or by laser processing in the condition where a tape is attached to the back side of the wafer and the front side of the wafer is exposed. Accordingly, there is a high possibility that foreign matter may stick to the front side of the wafer as the mount side. In particular, when tape dust generated in dicing sticks to the wafer, it is difficult to completely remove the tape dust even in performing spinner cleaning for the wafer. The foreign matter sticking to the mount side of the wafer causes a possibility of faulty mounting of each chip.

It is therefore an object of the present invention to provide a wafer processing method which can reduce faulty mounting of each chip.

In accordance with an aspect of the present invention, there is provided a wafer processing method of processing a wafer having a plurality of devices formed on the front side of the wafer, the devices being respectively formed in a plurality of regions defined by a plurality of crossing division lines, the front side of each device being a mount side to be mounted to a mounting substrate, the wafer processing method including: a dividing step of dividing the wafer along the division lines to obtain a plurality of chips respectively corresponding to the devices; and an irradiation step of applying ultraviolet radiation or plasma to the mount side of each chip after performing the dividing step, thereby generating ozone and active oxygen to remove organic matter present on the mount side.

Preferably, the wafer processing method further includes: an attaching step of attaching a protective tape to the front side of the wafer; a grinding step of holding the wafer through the protective tape on holding means after performing the attaching step and next grinding the back side of the wafer; and a peeling step of peeling the protective tape from the front side of the wafer after performing the grinding step; the irradiation step being performed after performing the peeling step.

In the wafer processing method according to the present invention, the irradiation step is performed after performing the dividing step of dividing the wafer into the individual chips. In the irradiation step, ultraviolet radiation or plasma is applied to the mount side of each chip to generate ozone and active oxygen, which functions to remove organic matter sticking to the mount side of each chip. Accordingly, it is possible to remove from the mount side of each chip not only foreign matter sticking to the wafer during handling the wafer, but also foreign matter generated in dividing the wafer, so that faulty mounting of each chip can be reduced.

Further, the peeling step is performed after performing the attaching step and the grinding step. Accordingly, even after peeling the protective tape, a releasing agent contained in an adhesive layer forming the protective tape is left on the front side of the wafer, causing an increase in water repellency of the front side of the wafer. However, since the irradiation step is performed after dividing the wafer into the individual chips, the increased water repellency of the front side of the wafer can be reduced to thereby reduce the faulty mounting of each chip due to the attachment of the protective tape.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 1A is a perspective view of a cutting apparatus;

FIG. 1B is a sectional view showing the configuration of a cassette and a cassette placing mechanism included in the cutting apparatus shown in FIG. 1A;

DETAILED DESCRIPTION OF THE PREFERRED EMBODIMENT

Figure 2:
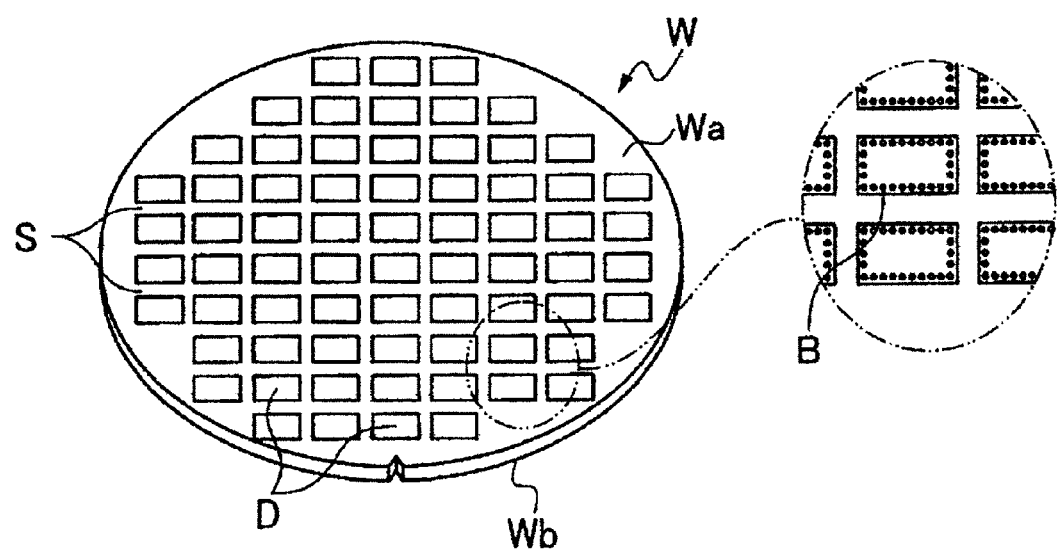
FIG. 2 is a perspective view showing the configuration of a wafer.

Referring to FIG. 1A, there is shown a cutting apparatus 1. The cutting apparatus 1 has a unit base 2. The upper portion of the unit base 2 is provided with a cassette placing mechanism 10 for placing a cassette 3 storing a wafer W as a workpiece, a rotatable holding table 4 for holding the wafer W, cutting means 5 for cutting the wafer W held on the holding table 4, a temporary setting area 8 for temporarily setting the wafer W, and cleaning means 9 for cleaning the wafer W after cutting. The holding table 4 is movable in the X direction shown by an arrow X in FIG. 1A.

The cutting means 5 essentially includes a spindle 50 having an axis extending in the Y direction shown by an arrow Y in FIG. 1A, a housing 51 for supporting the spindle 50 so that the spindle 50 is rotatable, a cutting blade 52 mounted on the front end of the spindle 50, and a blade cover 53 for covering the cutting blade 52 so that the cutting blade 52 is rotatable.

Accordingly, in operating the cutting means 5, the spindle 50 is rotated to thereby rotate the cutting blade 52 at a predetermined rotational speed.

The cutting apparatus 1 further includes first transfer means 6a for transferring the wafer W from the temporary setting area 8 to the holding table 4 before cutting and also transferring the wafer W from the cleaning means 9 to the temporary setting area 8 after cleaning, handling means 7 for taking the wafer W into and out of the cassette 3 placed on the cassette placing mechanism 10, and second transfer means 6b for transferring the wafer W from the holding table 4 to the cleaning means 9 after cutting.

As shown in FIG. 1B, the cassette 3 has a front opening 3a for allowing the handling means 7 to take the wafer W into and out of the cassette 3. A plurality of shelves 3b for supporting a plurality of wafers W are formed inside the cassette 3 so as to be vertically arranged at given intervals. As shown in FIG. 1B, the cassette placing mechanism 10 includes a UV applying unit 100 for applying ultraviolet radiation to the wafer W and elevating means 110 for vertically moving the cassette 3 placed on the cassette placing mechanism 10 in the Z direction shown by an arrow Z in FIG. 1A. The UV applying unit 100 has a frame 101, and the upper portion of the frame 101 is formed as a cassette placing portion 102a for placing the cassette 3. A supporting portion 102b for supporting the wafer W from the underside thereof is provided inside the frame 101. The supporting portion 102b is formed from a transparent member such as a glass plate.

An upper chamber 104 is defined above the supporting portion 102b inside the frame 101, and a lower chamber 105 is defined below the supporting portion 102b inside the frame 101. A plurality of UV lamps 106 are provided in the upper chamber 104 so as to be regularly arranged. Each UV lamp 106 is, for example, a low-pressure mercury lamp, which can apply ultraviolet radiation having a wavelength of 184 nm and ultraviolet radiation having a wavelength of 254 nm. The UV lamps 106 may be replaced by excimer UV lamps capable of applying ultraviolet radiation having a wavelength of 172 nm or a plasma generating apparatus for generating atmospheric-pressure plasma.

A plurality of UV lamps 106a for applying ultraviolet radiation having a wavelength of 300 to 400 nm are provided in the lower chamber 105 so as to be regularly arranged. Further, an ozone treatment chamber 107 for treating ozone and an inert gas storing chamber 109 for storing an inert gas such as nitrogen gas are defined below the lower chamber 105 so as to be partitioned therefrom by a partitioning portion 102c. The ozone treatment chamber 107 is provided with a filter 108 and an exhaust fan 108a. The ozone treatment chamber 107 is in communication with the upper chamber 104 through a passage 103. Ozone generated in the upper chamber 104 is passed through the passage 103 and the filter 108 and thereby treated in the ozone treatment chamber 107. The partitioning portion 102c is provided with an on-off valve 109a, and the inert gas storing chamber 109 can supply the inert gas through the on-off valve 109a of the partitioning portion 102c to the lower chamber 105.

The UV applying unit 100 is supported to the elevating means 110 so as to be vertically movable. The elevating means 110 essentially includes an elevating support 111 for supporting a bottom portion 102d of the frame 101 from the underside thereof, a ball screw 112 threadedly engaged with a nut formed at a lower end portion of the elevating support 111, a motor 113 connected to the lower end of the ball screw 112, and a guide rail 114 extending parallel to the ball screw 112. Accordingly, when the ball screw 112 is rotated by the motor 113, the elevating support 111 can be vertically moved.

A processing method for the wafer W shown in FIG. 2 will now be described. The wafer W is a circular workpiece as an example. A plurality of crossing division lines S are formed on the wafer W to thereby define a plurality of separate regions where a plurality of devices D are respectively formed. The wafer W has a front side Wa where the devices D are formed and a back side Wb opposite to the front side Wa. The back side Wb of the wafer W is to be held on the holding table 4 shown in FIG. 1A. As shown in a partially enlarged view of the wafer W in FIG. 2, a plurality of ball-shaped bumps B as projection electrodes are formed on each device D formed on the front side Wa of the wafer W.

(1) Attaching Step

Figure 3:
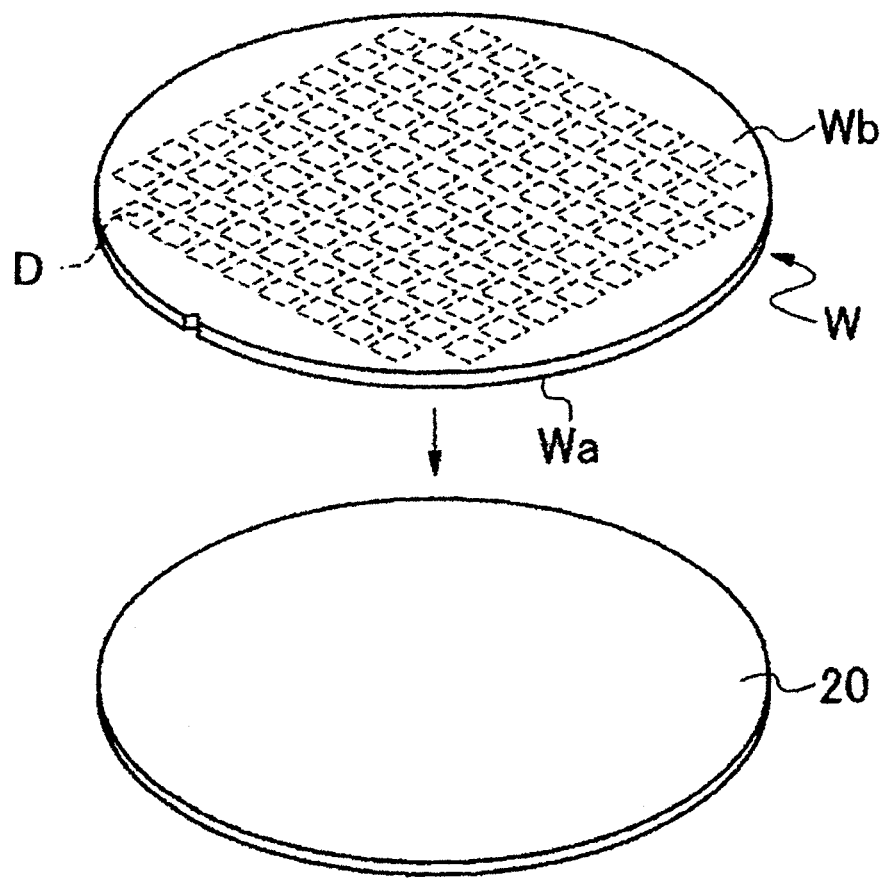
FIG. 3 is a perspective view showing an attaching step.

As shown in FIG. 3, the wafer W is inverted and opposed to a circular protective tape 20 having substantially the same diameter as that of the wafer W. In this condition, the front side Wa of the wafer W is attached to the protective tape 20. As a result, the wafer W and the protective tape 20 are united in the condition where the back side Wb of the wafer W is exposed.

(2) Grinding Step

Figure 4:
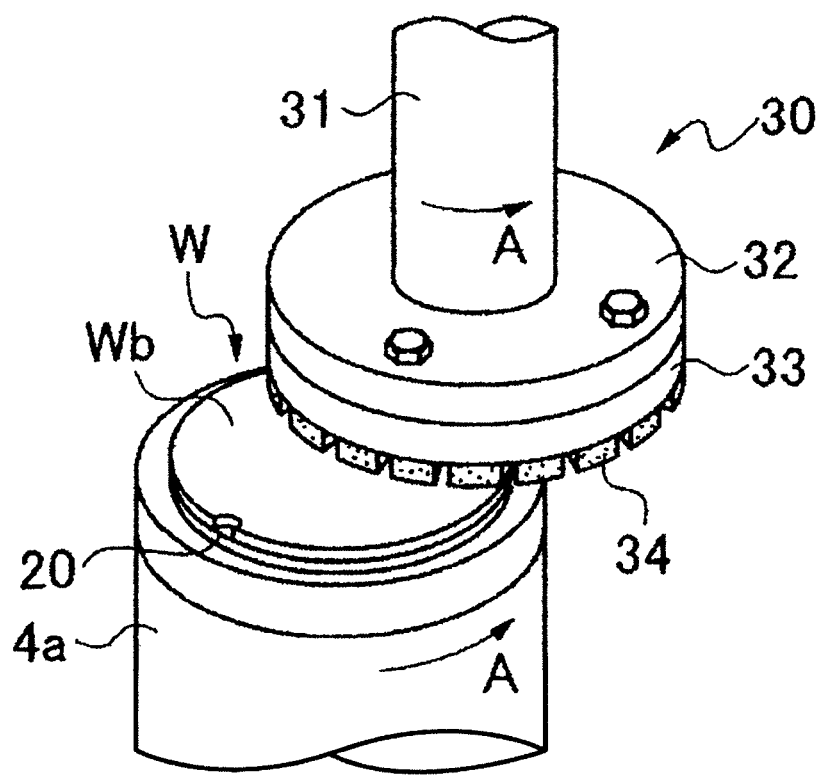
FIG. 4 is a perspective view showing a grinding step.

After performing the attaching step, a grinding step of grinding the back side Wb of the wafer W is performed by using grinding means 30 shown in FIG. 4. The grinding means 30 essentially includes a spindle 31 having an axis extending in the vertical direction, a mount 32 fixed to the lower end of the spindle 31, a grinding wheel 33 mounted on the lower surface of the mount 32, and a plurality of abrasive members 34 fixed to the lower surface of the grinding wheel 33 so as to be annularly arranged. Accordingly, when the spindle 31 is rotated by a motor (not shown), the grinding wheel 33 can be rotated at a predetermined rotational speed.

In grinding the wafer W, the unit of the wafer W and the protective tape 20 is placed on a rotatable holding table 4a for holding a workpiece in the condition where the protective tape 20 is in contact with the holding table 4a. Thereafter, a vacuum source (not shown) is operated to hold the wafer W on the holding table 4a under suction. Thereafter, the holding table 4a is rotated in the direction shown by an arrow A. At the same time, the grinding wheel 33 is also rotated in the same direction A as that of rotation of the holding table 4a. Thereafter, the grinding wheel 33 is lowered until the abrasive members 34 come into contact with the back side Wb of the wafer W. Thereafter, the abrasive members 34 are pressed against the back side Wb of the wafer W to thereby grind the back side Wb of the wafer W until the thickness of the wafer W reaches a predetermined thickness.

(3) Peeling Step

Figure 5:
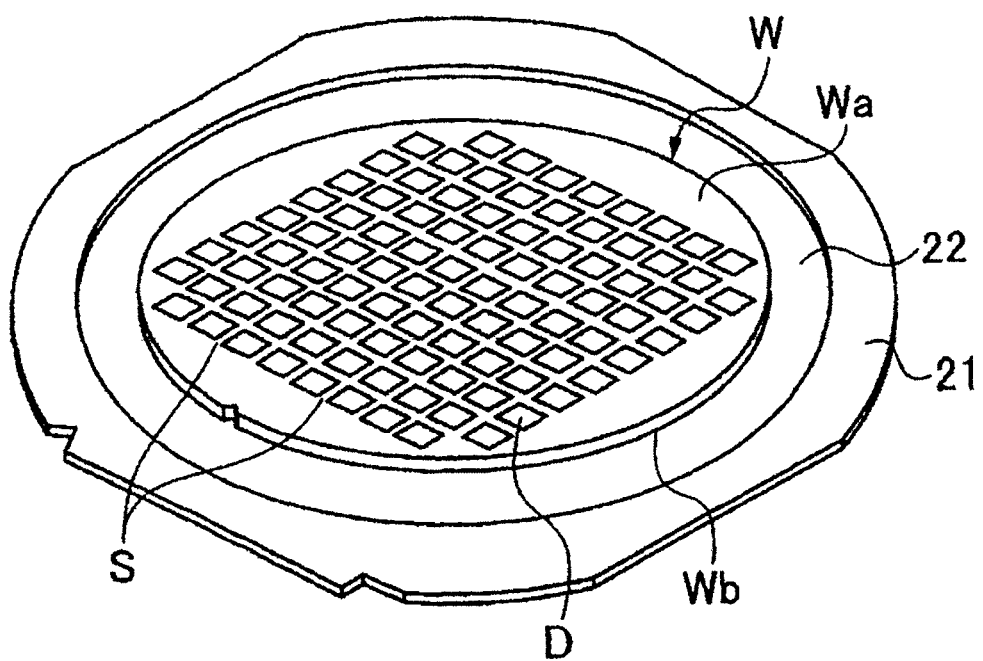
FIG. 5 is a perspective view showing a peeling step.

After performing the grinding step, a dicing tape 22 is attached to the lower surface of an annular frame 21 having a central opening, and the back side Wb of the wafer W is attached to the dicing tape 22 exposed to the central opening of the annular frame 21 as shown in FIG. 5. Thereafter, the protective tape 20 shown in FIG. 3 is peeled from the front side Wa of the wafer W.

(4) Dividing Step

After performing the peeling step, the wafer W is cut by using the cutting apparatus 1 shown in FIG. 1A. First, a plurality of wafer W each supported through the dicing tape 22 to the annular frame 21 are stored into the cassette 3 shown in FIGS. 1A and 1B, and the cassette 3 is next placed on the cassette placing mechanism 10. The handling means 7 is next operated to take one of the wafers W out of the cassette 3 and carry this wafer W to the temporary setting area 8. Thereafter, the first transfer means 6a is operated to transfer the wafer W from the temporary setting area 8 to the holding table 4.

Thereafter, the holding table 4 holding the wafer W is moved in the X direction to the position below the cutting means 5.

Figure 6:
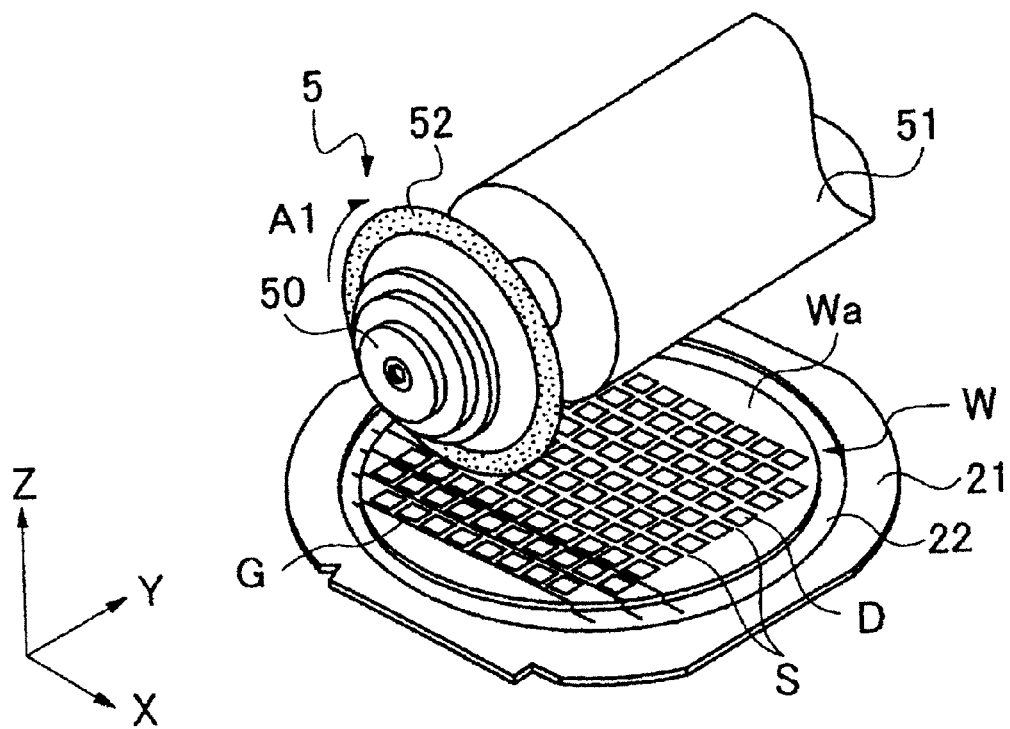
FIG. 6 is a perspective view showing a dividing step.
Figure 7:
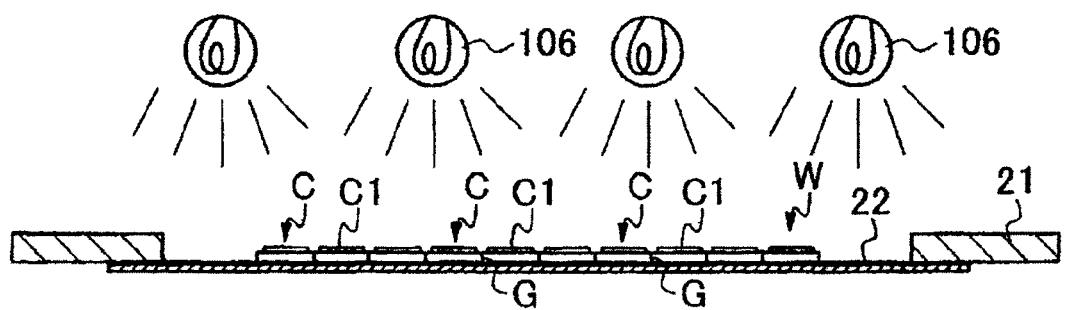
FIG. 7 is a sectional view showing an irradiation step.

As shown in FIG. 6, the spindle 50 of the cutting means 5 is rotated to thereby rotate the cutting blade 52 at a predetermined rotational speed in the direction shown by an arrow A1. Further, the cutting blade 52 is lowered in the Z direction to cut into the wafer W, and the wafer W (the holding table 4) is moved in the X direction along a predetermined one of the division lines S extending in a first direction parallel to the X direction, thereby forming a groove G along this predetermined division line S. Thereafter, the cutting blade 52 is indexed in the Y direction to similarly repeat the above cutting operation along all of the division lines S extending in the first direction, thereby forming a plurality of grooves G along these division lines S. Thereafter, the wafer W (the holding table 4) is rotated 90 degrees to similarly repeat the above cutting operation along all of the other division lines S extending in a second direction perpendicular to the first direction, thereby forming a plurality of grooves G along all of the other division lines S extending in the second direction. Thusly, the wafer W is fully cut to form the grooves G each having a depth equal to the thickness of the wafer W, thereby obtaining a plurality of individual chips C divided from each other as shown in FIG. 7.

While the wafer W is fully cut by using the cutting means 5 in the above dividing step, the configuration of the dividing step in the present invention is not limited to the above preferred embodiment. For example, a laser beam may be used to fully cut the wafer W by ablation. As a modification, a laser beam may be used to half cut the wafer W, thereby forming a processed groove having a depth less than the thickness of the wafer W along each division line S. As another modification, a laser beam may be used to form a modified layer inside the wafer W along each division line S. Then, the wafer W may be divided from the processed groove or the modified layer as a division start point, thereby obtaining the individual chips C.

(5) Cleaning Step

After performing the dividing step, the second transfer means 6b shown in FIG. 1A is operated to transfer the wafer W from the holding table 4 to the cleaning means 9. In the cleaning means 9, the wafer W is cleaned to remove cut dust sticking to the wafer W. Thereafter, the first transfer means 6a is operated to transfer the wafer W to the temporary setting area 8.

(6) Irradiation Step

After performing the cleaning step, an irradiation step is performed in such a manner that the UV applying unit 100 shown in FIG. 1B is operated to apply ultraviolet radiation to the wafer W. First, as shown in FIG. 1B, the elevating means 110 is operated to raise the cassette 3 and the frame 101 of the UV applying unit 100. Thereafter, the handling means 7 is operated to carry the wafer W from the temporary setting area 8 into the upper chamber 104 of the UV applying unit 100 and then place the wafer W on the supporting portion 102b of the upper chamber 104.

In the condition where the wafer W is placed on the supporting portion 102b, the plural UV lamps 106 are operated to apply ultraviolet radiation having a wavelength of 185 nm and ultraviolet radiation having a wavelength of 254 nm toward the front side of each chip C as a mount side C1. At this time, the ultraviolet radiation having a wavelength of 185 nm is absorbed by the oxygen ($O_2$) in the atmosphere to thereby generate ozone ($O_3$). Further, the ultraviolet radiation having a wavelength of 254 nm is absorbed by the ozone generated above to thereby generate active oxygen. This active oxygen functions to decompose organic matter (e.g., cut dust and tape dust) sticking to the mount side C1 of each chip C, thereby removing the organic matter from the mount side C1 of each chip C. In this irradiation step, the ozone generated in the upper chamber 104 shown in FIG. 1B is drawn through the passage 103 and the filter 108 into the ozone treatment chamber 107 and then discharged to the outside by the exhaust fan 108a.

In the attaching step mentioned above, the protective tape 20 is attached to the front side Wa of the wafer W. In the peeling step mentioned above, the protective tape 20 is peeled from the front side Wa of the wafer W. However, even after the peeling step, a releasing agent contained in an adhesive layer forming the protective tape 20 is left on the mount side C1. If a mounting step to be hereinafter described is performed in the condition where the releasing agent is left on the mount side C1 to cause an increase in water repellency of the mount side C1, faulty mounting of each chip C may easily occur. To cope with this problem, the irradiation step is performed according to the present invention to apply ultraviolet radiation or plasma to the mount side C1, thereby reducing the increased water repellency of the mount side C1. As a result, it is possible to reduce the faulty mounting of each chip C due to the attachment of the protective tape 20.

In the case of using a plasma generating apparatus in place of the UV lamps 106 to perform the irradiation step, atmospheric-pressure plasma may be applied to the mount side C1 of each chip C, thereby removing organic matter sticking to the mount side C1. Furthermore, the affinity or hydrophobicity of the mount side C1 for water can be changed by the application of the atmospheric-pressure plasma. Accordingly, the increased water repellency of the mount side C1 can be reduced. The affinity or hydrophobicity for water can be changed according to the gas to be used in the plasma generating apparatus. In the case of using such a plasma generating apparatus in the cassette placing mechanism 10, no chamber is required, so that the configuration of the apparatus can be made simple to thereby suppress a process cost.

The irradiation step may be performed after performing the dividing step and before mounting each chip C on a mounting substrate. That is, the performance of the irradiation step is not limited in the cutting apparatus 1. For example, the irradiation step may be performed in an expanding apparatus for expanding an expanding tape to divide a workpiece or in a pickup apparatus for picking up the workpiece from the tape.

(7) Tape Adhesion Reducing Step

Figure 8:
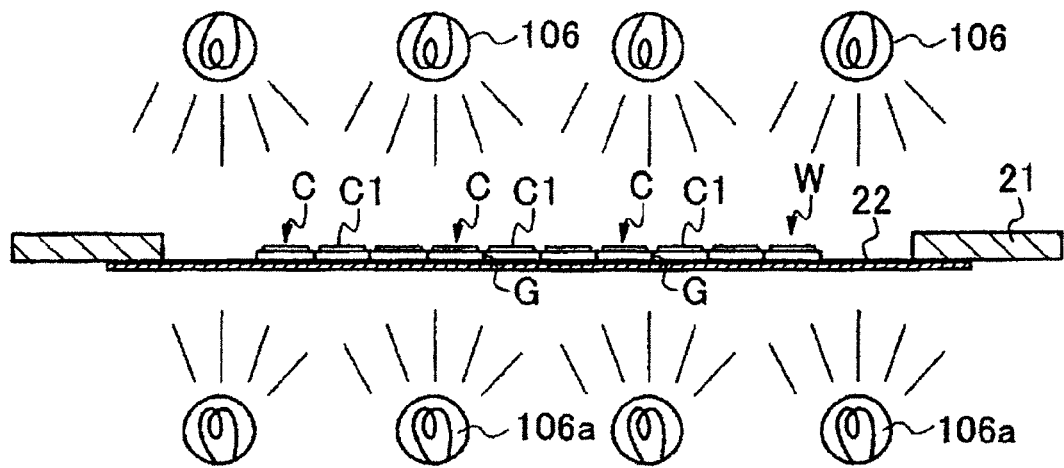
FIG. 8 is a sectional view showing a tape adhesion reducing step.

Simultaneously with the irradiation step or before or after the irradiation step, a tape adhesion reducing step is performed to reduce the adhesion of the dicing tape 22. In the case of performing the tape adhesion reducing step simultaneously with the irradiation step as shown in FIG. 8, the UV lamps 106 located above the wafer W are operated to essentially apply the ultraviolet radiation having a wavelength of 185 nm and the ultraviolet radiation having a wavelength of 254 nm toward the mount side C1 of each chip C as described above. At the same time, the UV lamps 106a located below the wafer W are also operated to apply ultraviolet radiation having a peak wavelength of 365 nm in the range of 300 to 400 nm toward the entire surface of the dicing tape 22 from the underside thereof.

At this time, the on-off valve 109a of the partitioning portion 102c shown in FIG. 1B is opened to supply an inert gas from the inert gas storing chamber 109 to the lower chamber 105. Accordingly, the ultraviolet radiation generated from the UV lamps 106a and passed through the supporting portion 102b can be efficiently applied to the dicing tape 22 shown in FIG. 8. As a result, the dicing tape 22 is hardened to reduce its adhesion, thereby facilitating the peeling of each chip C from the dicing tape 22.

(8) Pickup Step

Figure 9:
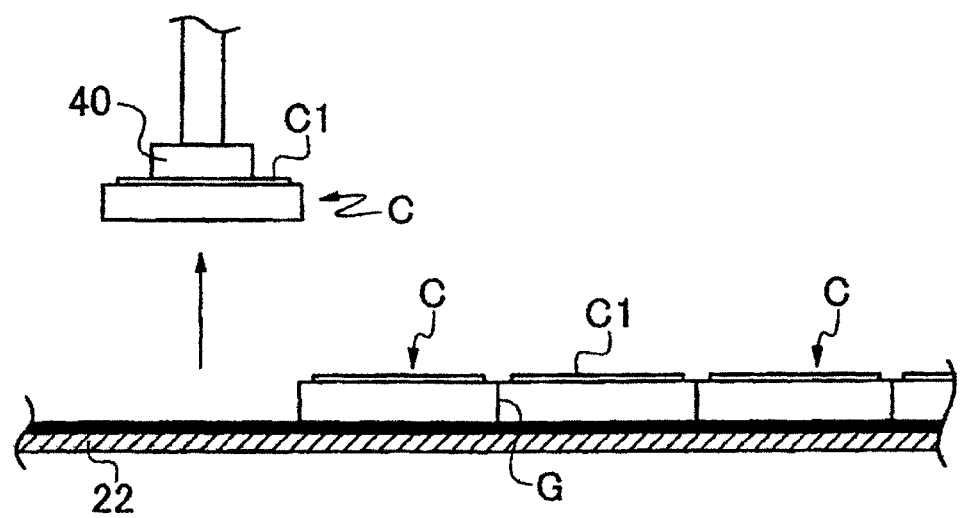
FIG. 9 is a sectional view showing a pickup step.

After performing the tape adhesion reducing step, a pickup step is performed to pick up each chip C from the dicing tape 22 by using a collet 40 as shown in FIG. 9. The collet 40 has a suction holding surface for holding each chip C under suction. The collet 40 is movable in the vertical direction. Accordingly, the collet 40 is operated to hold the mount side C1 of each chip C under suction and then raised to thereby pick up each chip C from the dicing tape 22. When all of the chips C are picked up from the dicing tape 22 and then transferred, the pickup step is finished.

(9) Mounting Step

Figure 10:
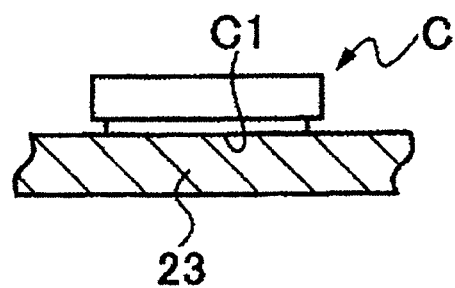
FIG. 10 is a sectional view showing a mounting step.

After performing the pickup step, a mounting step is performed to mount each chip C on a mounting substrate 23 as shown in FIG. 10. More specifically, the mount side C1 of each chip C is electrically connected to the mounting substrate 23, wherein the ball-shaped bumps B shown in FIG. 2 are formed on the mount side C1. Thusly, the mounting step is finished.

In the wafer processing method according to this preferred embodiment, the irradiation step is performed after performing the dividing step of dividing the wafer W into the individual chips C. In the irradiation step, ultraviolet radiation or plasma is applied to the mount side C1 of each chip C to generate ozone ($O_3$) and active oxygen, which functions to remove organic matter sticking to the mount side C1 of each chip C. Accordingly, it is possible to remove not only foreign matter sticking to the wafer W during handling the wafer W, but also foreign matter generated in dividing the wafer W, so that faulty mounting of each chip C can be reduced.

Further, the peeling step is performed after performing the attaching step and the grinding step. Accordingly, even after peeling the protective tape 20, a releasing agent contained in an adhesive layer forming the protective tape 20 is left on the front side Wa of the wafer W, causing an increase in water repellency of the front side Wa of the wafer W. However, since the irradiation step is performed after dividing the wafer W into the individual chips C, the increased water repellency of the front side Wa of the wafer W can be reduced to thereby reduce the faulty mounting of each chip C.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer having a plurality of devices formed on a front side of said wafer, said devices being respectively formed in a plurality of regions defined by a plurality of crossing division lines, a front side of each device being a mount side to be mounted to a mounting substrate, said wafer processing method comprising:

an attaching step of attaching a protective tape to the front side of said wafer;

a grinding step of holding said wafer through said protective tape on holding means after performing said attaching step and next grinding a back side of said wafer;

a peeling step of peeling said protective tape from the front side of said wafer after performing said grinding step;

a dividing step of dividing said wafer along said division lines to obtain a plurality of chips respectively corresponding to said devices after performing said peeling step; and an irradiation step of applying ultraviolet radiation having (a) a wavelength of 185 nm and a wavelength of 254 nm or (b) a single wavelength of 172 nm to said mount side of each chip after performing said dividing step, thereby generating ozone and active oxygen to remove organic matter including a releasing agent contained in an adhesive layer of said protective tape sticking to said mount side and reducing water repellency of said mount side.

2. A wafer processing method of processing a wafer having a plurality of devices formed on a front side of said wafer, said devices being respectively formed in a plurality of regions defined by a plurality of crossing division lines, a front side of each device being a mount side to be mounted to a mounting substrate, said wafer processing method comprising:

an attaching step of attaching a protective tape to the front side of said wafer;

a grinding step of holding said wafer through said protective tape on holding means after performing said attaching step and next grinding a back side of said wafer;

a peeling step of peeling said protective tape from the front side of said wafer after performing said grinding step;

a dividing step of dividing said wafer along said division lines to obtain a plurality of chips respectively corresponding to said devices after performing said peeling step; and an irradiation step of applying atmospheric-plasma to said mount side of each chip after performing said dividing step, thereby removing organic matter including a released agent contained in an adhesive layer of said protective tape sticking to said mount side and changing water repellency of said mount side to hydrophobicity.

* * * * *